(12) United States Patent
Lee et al.

(10) Patent No.: US 8,901,532 B2
(45) Date of Patent: Dec. 2, 2014

(54) NON-VOLATILE PROGRAMMABLE DEVICE INCLUDING PHASE CHANGE LAYER AND FABRICATING METHOD THEREOF

(75) Inventors: Seung Yun Lee, Daejeon (KR); Young Sam Park, Daejeon (KR); Sung Min Yoon, Daejeon (KR); Soonwon Jung, Daejeon (KR); Sang Hoon Cheon, Daejeon (KR); Byoung Gon Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/466,411

(22) Filed: May 8, 2012

(65) Prior Publication Data

US 2012/0217465 A1    Aug. 30, 2012

Related U.S. Application Data

(62) Division of application No. 12/491,465, filed on Jun. 25, 2009, now abandoned.

(30) Foreign Application Priority Data

Dec. 16, 2008  (KR) .................. 10-2008-0128176

(51) Int. Cl.
*H01L 47/00* (2006.01)
*H01L 45/00* (2006.01)
*H01L 27/24* (2006.01)
*G11C 13/00* (2006.01)

(52) U.S. Cl.
CPC .............. *H01L 45/148* (2013.01); *H01L 45/06* (2013.01); *H01L 27/2436* (2013.01); *H01L 45/122* (2013.01); *H01L 45/1206* (2013.01); *G11C 13/0004* (2013.01); *H01L 45/144* (2013.01)
USPC ........... 257/4; 257/2; 257/3; 257/5; 257/528; 257/774

(58) Field of Classification Search
CPC ..... H01L 45/144; H01L 45/04; H01L 45/143; H01L 45/06; H01L 45/148; H01L 45/122; H01L 45/1206; G11C 13/0004
USPC .......................................... 257/2–5, 528, 774
See application file for complete search history.

(56) References Cited

U.S. PATENT DOCUMENTS

| | | | | |
|---|---|---|---|---|
| 7,233,017 B2 * | 6/2007 | Yoon et al. | ......................... | 257/5 |
| 7,473,950 B2 * | 1/2009 | Fournier | ....................... | 257/295 |
| 7,547,906 B2 * | 6/2009 | Ovshinsky | ....................... | 257/3 |
| 7,547,913 B2 * | 6/2009 | Yoon et al. | ...................... | 257/42 |
| 8,228,719 B2 * | 7/2012 | Lowrey | ......................... | 365/163 |
| 2005/0127524 A1 * | 6/2005 | Sakamoto et al. | ............. | 257/774 |
| 2006/0091374 A1 * | 5/2006 | Yoon et al. | ......................... | 257/2 |
| 2006/0097240 A1 * | 5/2006 | Lowrey et al. | ..................... | 257/5 |
| 2006/0097343 A1 * | 5/2006 | Parkinson | ..................... | 257/528 |
| 2007/0096071 A1 * | 5/2007 | Kordus et al. | ..................... | 257/2 |
| 2008/0232160 A1 * | 9/2008 | Gopalakrishnan | ............. | 365/163 |
| 2008/0237564 A1 * | 10/2008 | Yoon et al. | ......................... | 257/3 |
| 2009/0224224 A1 * | 9/2009 | Fujii et al. | ......................... | 257/2 |
| 2009/0303783 A1 * | 12/2009 | Lowrey | ......................... | 365/163 |

* cited by examiner

*Primary Examiner* — Fernando L Toledo
*Assistant Examiner* — Mohammed Shamsuzzaman (57) ABSTRACT

Provided is a non-volatile programmable device including a first terminal, a first threshold switching layer connected to part of the first terminal, a phase change layer connected to the first threshold switching layer, a second threshold switching layer connected to the phase change layer, a second terminal connected to the second threshold switching layer, and third and fourth terminals respectively connected to a side portion of the phase change layer and the other side portion opposite to the side portion of the phase change layer.

12 Claims, 6 Drawing Sheets

NON-VOLATILE PROGRAMMABLE DEVICE INCLUDING PHASE CHANGE LAYER AND FABRICATING METHOD THEREOF

CROSS-REFERENCE TO RELATED PATENT APPLICATION

This application claims the benefit of Korean Patent Application No. 10-2008-0128176, filed on Dec. 16, 2008, in the Korean Intellectual Property Office, the disclosure of which is incorporated herein in its entirety by reference, and is a divisional of U.S. application Ser. No. 12/491,465, which was filed on Jun. 25, 2009 now abandoned.

BACKGROUND OF THE INVENTION

1. Field of the Invention

The present invention relates to a programmable logic device and a method of manufacturing the programmable logic device, and more particularly, to a non-volatile programmable device included in a programmable logic device and a method of manufacturing the non-volatile programmable device.

2. Description of the Related Art

A programmable logic device (PLD), such as a field-programmable gate array (FPGA), a programmable logic array (PLA), a programmable array logic (PAL), a complex programmable logic device (CPLD), and so forth, is an electronic component which is manufactured with no fixed function but obtains a particular function according to programming by a user. In particular, due to continuous improvement of the performance and the reduced manufacturing costs of the PLD, FPGAs are widely used in digital devices such as plasma display panels (PDPs) or liquid crystal display televisions (LCD TVs) or portable devices such as camcorders and Blue-ray disks.

Figure 1:
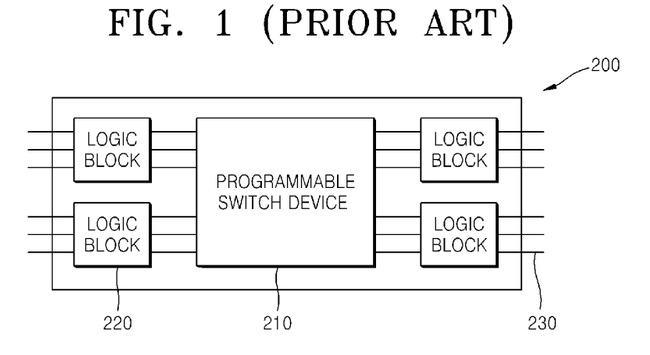
FIG. 1 is a block diagram illustrating a general programmable logic device.

FIG. 1 is a block diagram illustrating a general PLD 200.

In detail, the general PLD 200 includes a logic block 220, a programmable switch device 210, and interconnect wires 230. The PLD 200 includes the programmable switch device 210 that connects the logic block 220 to the interconnect wires 230 or connects the interconnect wires 230 according to programming by a user. Examples of the programmable switch device 210 include a fuse, an erasable programmable read-only memory (EPROM), an electrically erasable programmable read-only memory (EEPROM), a static random access memory (SRAM), a flash memory, etc.

Figure 2:
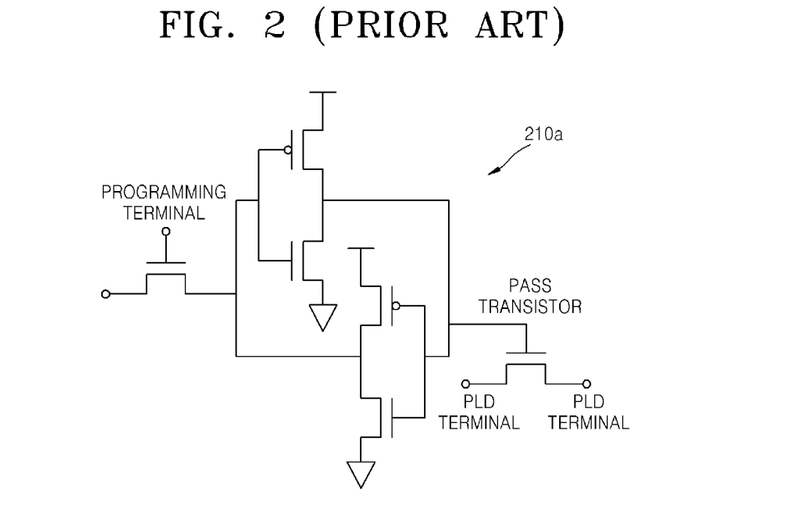
FIG. 2 is a circuit diagram illustrating a programmable logic device in which a static random access memory (SRAM) is used as a programmable switch device according to the prior art.

FIG. 2 is a circuit diagram illustrating a programmable logic device in which a SRAM 210 is used as a programmable switch device, according to the prior art.

In detail, the SRAM 210a corresponds to a switch device 210 in programmable logic devices 200 of FIG. 1. That is, the SRAM 210a function as a switch device 210 that turns on and off between programmable logic devices 200 by controlling a gate node of a pass transistor. The SRAM 210a has a high erasing and writing speed, and is manufactured using a well-established CMOS process, and thus, can be designed easily. However, the SRAM 210a is volatile and thus requires an additional external memory when powering up. The additional external memory is vulnerable in regard to data protection because data therein can be easily read. In addition, when the SRAM 210a is used as a programmable switch device 210, data change errors or failure in a circuit may occur due to radiation by heavy ions or high-energy protons.

Figure 3:
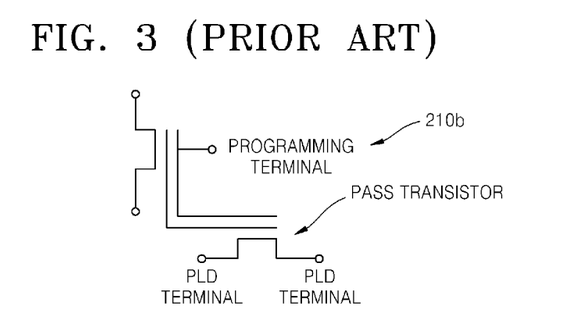
FIG. 3 is a circuit diagram illustrating a programmable logic device in which a flash memory is used as a switch device according to the prior art.

FIG. 3 is a circuit diagram illustrating a programmable logic device in which a flash memory 210b is used as a programmable switch device according to the prior art.

In detail, the flash memory 210b corresponds to a switch device 210 in programmable logic devices 200 of FIG. 1. That is, when the flash memory 210b operates as a switch device 210 to turn on and off between programmable logic devices 200 by controlling a gate node of a pass transistor. The flash memory 210b is non-volatile, and is formed of two transistors as illustrated in FIG. 3, and thus, a surface area of the flash memory 210b is smaller than that of the SRAM 210a.

However, the flash memory 210b has poorer operation frequency characteristics than the SRAM 210a and is manufactured with a different process than a standard CMOS process. In addition, when a flash memory 210b is used as a switch 210, data change errors or failure in a circuit may occur due to radiation by heavy ions or high-energy protons.

SUMMARY OF THE INVENTION

The present invention provides a programmable device that has non-volatile characteristics, is resistant to radiation, and is realizable not only as a switch but also as a memory, in order to overcome the disadvantages of a static random access memory (SRAM) or a flash memory.

According to an aspect of the present invention, there is provided a non-volatile programmable device comprising: a first terminal; a first threshold switching layer connected to the first terminal; a phase change layer connected to the first threshold switching layer; a second threshold switching layer connected to the phase change layer; a second terminal connected to the second threshold switching layer; and a third terminal and a fourth terminal respectively connected to a side portion of the phase change layer and the other side portion opposite to the side portion of the phase change layer.

The phase change layer may be formed of a chalcogenide including one of sulfur (S), selenium (Se), and tellurium (Te), or an antimony compound including antimony (Sb). The first threshold switching layer or the second threshold switching layer may be formed of a chalcogenide that includes one of sulfur (S), selenium (Se), and tellurium (Te), and that further includes arsenic (As) or phosphorus (P). The non-volatile programmable device may further comprise a metal-oxide-semiconductor (MOS) transistor having a source/drain terminal connected to the third terminal or the fourth terminal and a gate terminal connected to the second terminal.

According to another aspect of the present invention, there is provided a non-volatile programmable device comprising: a first terminal; a first threshold switching layer, a phase change layer, a second threshold switching layer, and a second terminal sequentially formed on the first terminal; and a third terminal and a fourth terminal respectively connected to a side portion of the phase change layer and the other side portion opposite to the side portion of the phase change layer, wherein an electrical pulse is supplied to the phase change layer through the first terminal, the first threshold switching layer, the second threshold switching layer, and the second terminal generate a reversible phase change of the phase change layer and control an electric signal that moves through the third terminal, the phase change layer, and the fourth terminal.

The first threshold switching layer and the second threshold switching layer may be formed of a threshold switching material. The phase change layer may be formed of a material that changes reversibly between an amorphous state and a crystalline state according to the amount of applied current.

According to another aspect of the present invention, there is provided a non-volatile programmable device comprising: a first metal layer formed on a semiconductor substrate; a first threshold switching layer formed on part of the first metal layer; and a second metal layer formed on the first metal layer and the first threshold switching layer. A phase change layer may be formed through the second metal layer and the insulating layer and connected to the first threshold switching layer, a second threshold switching layer may be formed on the phase change layer. A third metal layer that is connected to the first metal layer and to the first threshold switching layer may be formed. A fourth metal layer may be formed on the second threshold switching layer. Accordingly, the third metal layer and the fourth metal layer may be first and second terminals connected to the first threshold switching layer and the second threshold switching layer, respectively, and a side portion of the second metal layer and the other side portion opposite to the side portion of the second metal layer may be third and fourth terminals which are respectively connected to the phase change layer.

The non-volatile programmable device according to the present invention uses a phase change layer and thus has high resistance to radiation, is non-volatile, and has good repetitive writing characteristics.

The non-volatile programmable device according to the present invention uses a phase change phenomenon which occurs very fast, thereby increasing the operational speed of the programmable device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A programmable logic device (PLD) includes at least one logic block, a programmable device, and interconnect wires in the present invention. Especially, the PLD includes the programmable device, e.g., a programmable switch device, that connects the logic block to the interconnect wires or connects the interconnect wires according to programming by a user.

According to the present invention, a phase change material (phase change layer) is used in the programmable device. A crystalline state and the electrical resistance of the phase change material vary according to an electrical pulse input, and the phase change material has non-volatility that the electrical resistance of the phase change material is maintained until an electrical pulse is inputted. Also, until the temperature of the phase change material is increased to a crystallization temperature or a melting point, neither a phase change nor a resistance change occurs, and thus, the phase change material has high resistance to radiation.

Some of the phase change material such as chalcogenide including chalcogen elements, e.g., sulfur (S), selenium (Se), and tellurium (Te), or an antimony compound including antimony (Sb) shows a switching behavior that an electrical resistance changes according to an voltage input or a current input. The switching behavior may be classified as threshold switching and memory switching.

The present invention will now be described more fully with reference to the accompanying drawings, in which exemplary embodiments of the invention are shown. The present invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, like reference numerals denote like elements.

Figure 4A:
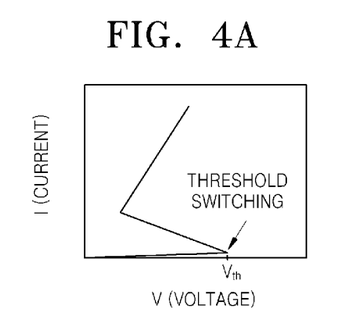
FIGS. 4A and 4B are graphs showing threshold switching according to an inventive concept of the present invention.
Figure 4B:
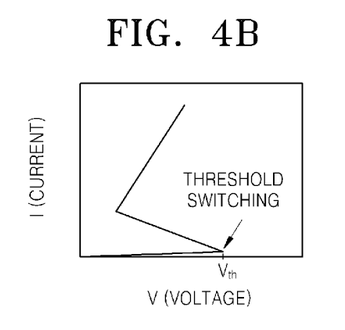

FIGS. 4A and 4B are graphs showing threshold switching according to an inventive concept of the present invention.

In detail, threshold switching refers to an instant decrease in electrical resistance at a predetermined voltage; a low resistance of several hundreds of ohms is maintained while an electrical field at a critical voltage value (Vth) or greater is applied, but as soon as the electric field is removed, the electrical resistance returns to a high resistance of several mega (M) ohms. Accordingly, an identical current (I)-voltage (V) curve is obtained both at a first sweep as illustrated in FIG. 4A and at a second sweep as illustrated in FIG. 4B. Threshold switching is not a thermal process but an electrical process, and the electrical resistance is lowered due to the increase of carrier density or mobility in the electric field.

Figure 5A:
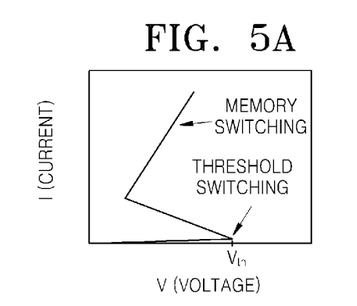
FIGS. 5A and 5B are graphs showing memory switching according to an inventive concept of the present invention.
Figure 5B:
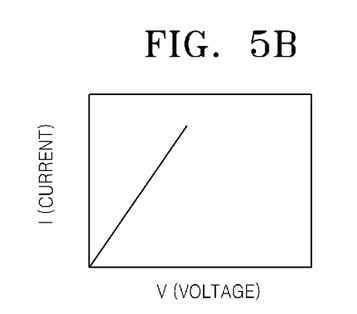

FIGS. 5A and 5B are graphs showing memory switching according to the inventive concept of the present invention.

In detail, as described above, some of the materials that show threshold switching also show memory switching due to a phase change. When memory switching occurs, a lowered resistance is maintained further than threshold switching, even when the electric field is removed. That is, while FIG. 5A is a graph showing memory switching occurring at a first sweep, a different current (I)-voltage (V) curve from the first sweep is obtained at a second sweep as illustrated in FIG. 5B.

When an electric field is applied and threshold switching occurs, a high current flows due to the lowered resistance and thus Joule heat is generated accordingly. When the temperature of a phase change material such as a chalcogenide is increased higher than a crystallization temperature due to the Joule heat, memory switching, in which a crystalline structure of the phase change material changes from an amorphous state at a high resistance to a crystalline state at a low resistance, occurs.

Whether or not there is an electric field, the resistance lowered by the memory switching is maintained for a considerable period of time, and this is a feature of the non-volatile programmable device. Reversible conversions between a low resistance state, that is, a set state, and a high resistance state, that is, a reset state, of a phase change material having a memory switching behavior are possible by inputting an appropriate electrical pulse to the phase change material.

In particular, to generate a reset state, a high electrical pulse is applied for a shorter time than when memory switching is conducted at a resistance of a phase change material, which is lowered by the memory switching, and then the temperature of the phase change material is increased higher than a melting point and thus the phase change material is changed into a liquid. After the electrical pulse is completely applied, the liquid crystalline state of the phase change material is maintained over time and the phase change material is cooled, and thus the phase change material stays in an amorphous state at the end. In order to obtain a reset state, a phase change material needs to be melted and an amorphous state needs to be obtained by quenching, and thus a high electrical pulse needs to be applied for a shorter time than when obtaining a set state.

As described above, some of the chalcogenides including chalcogen elements (e.g., S, Se, and Te) or the antimony compound including antimony (Sb) show two kinds of switching, that is, threshold switching where a high resistance changes to a low resistance according to an electrical pulse, and memory switching where phase transition occurs.

According to an embodiment of the present invention, a four-terminal programmable device, including a structure in which a first threshold switching layer, a phase change layer, and a second threshold switching layer are stacked, is realized as will be described below. The programmable device according to the present embodiment may be realized as a programmable switch device as described above. Also, the programmable device according to the present embodiment may be realized as a memory device including a phase change layer and having a memory function.

Figure 6:
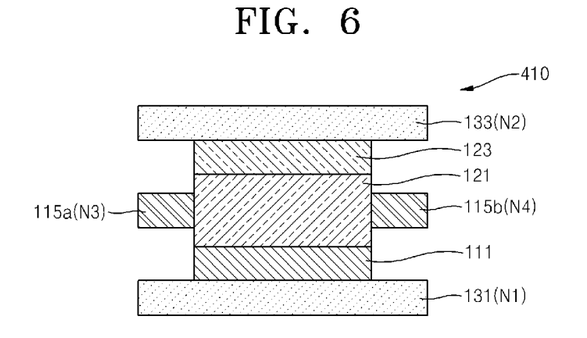
FIG. 6 is a schematic view illustrating a non-volatile programmable device in which a phase change layer is used, according to an embodiment of the present invention.

FIG. 6 is a schematic view illustrating a non-volatile programmable device 410 in which a phase change layer 121 is used, according to an embodiment of the present invention.

In detail, the non-volatile programmable device 410 that uses the phase change layer 121, according to the current embodiment of the present invention, includes a first terminal 131 (N1), a first threshold switching layer 111 connected to the first terminal 131, the phase change layer 121 formed on the first threshold switching layer 111, a second terminal 133 (N2) connected to a second threshold switching layer 123 that is formed on the phase change layer 121, and a third terminal 115a (N3) and a fourth terminal 115b (N4) connected to both sides of the phase change layer 121, that is, to a side portion of the phase change layer 121 and the other side portion opposite to the side portion of the phase change layer 121.

As described above, when an electric field of a critical value or greater is applied to the first threshold switching layer 111 and the second threshold switching layer 123, threshold switching characteristics that an electrical resistance is decreased temporarily occur. Also, when an electric field is applied to the first and second threshold switching layers 111 and 123, the electrical resistance of the first and second threshold switching layers 111 and 123 is decreased, and when the electric field is not applied, the electrical resistance thereof returns to the original electrical resistance.

The first threshold switching layer 111 and the second threshold switching layer 123 are formed of a chalcogenide that includes S, Se, or Te, and further includes arsenic (As) or phosphorus (P). In other words, some of the chalcogenides that include As or P have threshold switching characteristics because As or P forms a number of strong crosslinks in the chalcogenides. The first threshold switching layer 111 and the second threshold switching layer 123 may be formed of AsTe, AsSiTe, AsGeTe, AsGeSiTe, or AsGeSiPTe.

The phase change layer 121 is a reversible material that is convertible between an amorphous state and a crystalline state according to the amount of applied current. According to the current embodiment, the phase change layer 121 is formed of a chalcogenide including S, Se, or Te, or an antimony compound including Sb. Examples of the chalcogenide of the phase change layer 121 include GeTe, SbTe, SiTe, SbSe, InSe, GeSbTe, SiSbTe, InSbTe, GaSeTe, SnSbTe, GeSiSbTe, GeSnSbTe, GeSbSeTe, and AgInSbTe. Examples of the antimony compound of the phase change layer 121 include GeSb and ZnSb.

A phase change of the phase change layer 121 is generated through programming or writing by applying an electrical pulse through the first terminal 131 (N1) and the second terminal 133 (N2). When the phase change layer 121 is in a set state, since the resistance of the phase change layer 121 is low, the non-volatile programmable device 410 is on and a signal is transmitted through the third terminal 115a (N3) and the fourth terminal 115b (N4). When the phase change layer 121 is in a reset state, since the resistance of the phase change layer 121 is high, the programmable device 410 is turned off and the transmission of a signal through the third terminal 115a (N3) and the fourth terminal 115b (N4) is blocked.

For example, when the phase change layer 121 is formed of $Ge_2Sb_2Te_5$, the resistance of the phase change layer 121 is several hundreds of ohms or less in a set state, and the resistance of the phase change layer 121 is several M ohms or greater in a reset state, and thus a phase change switch formed of $Ge_2Sb_2Te_5$ can transmit or block a signal. Also, the non-volatile programmable device 410 according to the current embodiment may operate as a memory according to a set state or a reset state of the phase change layer 121.

The first and second threshold switching layers 111 and 123 prevent signal leaks through the first terminal 131 (N1) or the second terminal 133 (N2) which is used in programming. Since the first and second threshold switching layers 111 and 123 perform threshold switching and become conductive only when an electric field of a critical value or greater is applied as described above, even when there is a voltage difference between the third terminal 115a (N3) and the fourth terminal 115b (N4), a resistance of several M ohms is maintained and the leakage of signals is prevented.

For programming, a voltage that is greater than a total of critical voltages for threshold switching of each of the first threshold switching layer 111, the phase change layer 121, and the second threshold switching layer 123 is applied to the first terminal 131 (N1) and the second terminal 133 (N2) to generate a phase change in the phase change layer 121. A critical voltage for threshold switching is proportional to the thickness of a switching material; thus an appropriate value of the critical value may be determined by adjusting the thickness of the switching material.

Figure 7:
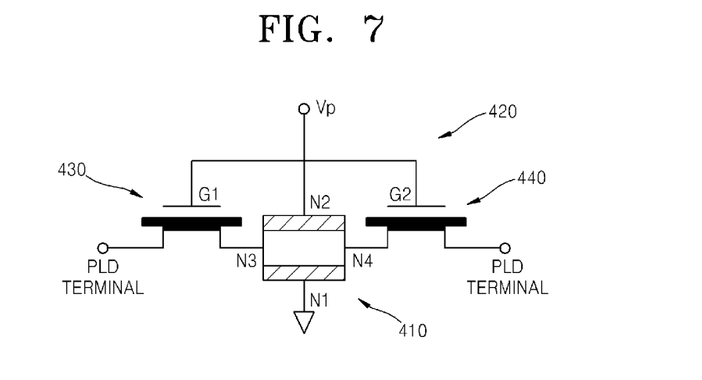
FIG. 7 is a schematic view illustrating a non-volatile programmable device in which a phase change layer is used, according to another embodiment of the present invention.

FIG. 7 is a schematic diagram illustrating a non-volatile programmable device 420 in which a phase change layer is used, according to another embodiment of the present invention.

In detail, the non-volatile programmable device 420 is formed of two metal-oxide-semiconductor (MOS) transistors 430 and 440 connected to the non-volatile programmable device 410 of FIG. 6. The MOS transistors 430 and 440 are depletion-mode devices in which the conductance of a built-in channel is reduced as a gate voltage is applied. Gate electrodes G1 and G2 of the MOS transistors 430 and 440 are commonly connected to a second terminal (N2), and a source/drain terminal of each of the MOS transistors 430 and 440 is connected to a third terminal (N3) and a fourth terminal (N4). The other source/drain terminal that is not connected to the third terminal and the fourth terminal is connected to a terminal of a programmable logic device (a PLD terminal), that is, an input/output terminal.

Like in the embodiment of FIG. 6, for programming, a voltage that is greater than a total of critical voltages for threshold switching of each of the first threshold switching layer 111, the phase change layer 121, and the second threshold switching layer 123 is applied to the first terminal 131 (N1) and the second terminal (N2) to thereby generate a phase change in the phase change layer 121. Here, a programming voltage is also applied to the gate electrodes G1 and G2 of the MOS transistors 430 and 440, and thus when the programming voltage is greater than a threshold voltage of the MOS transistors 430 and 440, a channel disappears and the non-volatile programmable device 420 is blocked from a logic block of the programmable logic device. In other words, unnecessary power supply to the logic block is prevented during the programming of the non-volatile programmable device 420.

FIGS. 8 through 12 are schematic views illustrating a non-volatile programmable device using a phase change layer and for describing a method of manufacturing the non-volatile programmable device, according to an embodiment of the present invention.

Figure 8:
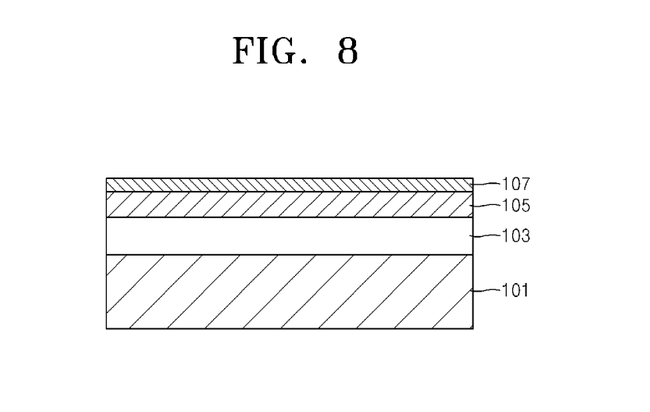
FIGS. 8 through 12 are schematic views illustrating a non-volatile programmable device using a phase change layer, and for describing a method of manufacturing the non-volatile programmable device, according to an embodiment of the present invention.

Referring to FIG. 8, the non-volatile programmable device includes a first insulating layer 103 formed on a semiconductor substrate 101, for example, on a silicon substrate. The first insulating layer 103 is formed using a thermal oxidization method or a chemical vapor deposition (CVD) method. The first insulating layer 103 is formed of an oxide layer or a nitride layer. A first metal material layer 105 is formed on the first insulating layer 103 using a material having high electrical conductivity. The first metal material layer 105 is formed of tungsten, titanium tungsten (TiW), polysilicon, aluminium (Al), or copper (Cu) formed using a sputtering method or a CVD method.

A first threshold switching material layer 107 is formed on the first metal material layer 105. When an electric field is applied, the electrical resistance of the first threshold switching material layer 107 is reduced, and when the electric field is not applied, the electrical resistance returns to the original electrical resistance. The first threshold switching material layer 107 includes S, Se, or Te, and is formed of a chalcogenide including As or P.

Figure 9:
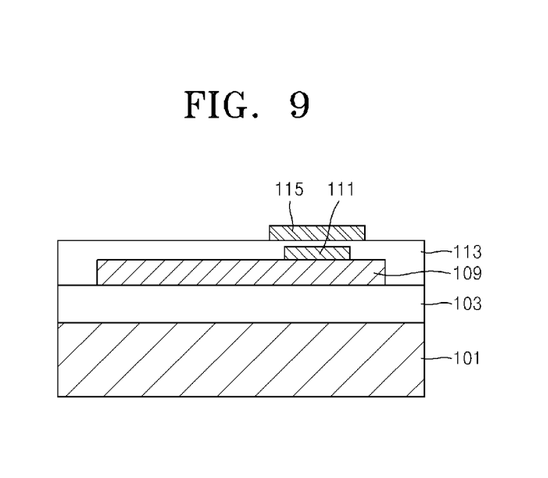

Referring to FIG. 9, the first threshold switching material layer 107 is patterned to form a first threshold switching layer 111. The first metal material layer 105 is patterned to form a first metal layer 109. Next, a second insulating layer 113 is formed on the first insulating layer 103 to cover the first threshold switching layer 111 and the first metal layer 109. The second insulating layer 113 is formed of the same material and the same method as the first insulating layer 103. Next, a second metal layer 115 is formed on the second insulating layer 113 such that the second metal layer 115 is formed of the same material and the same method as the first metal layer 109. The second metal layer 115 is formed by forming a second metal material layer (not shown) and then patterning the second metal material layer.

Figure 10:
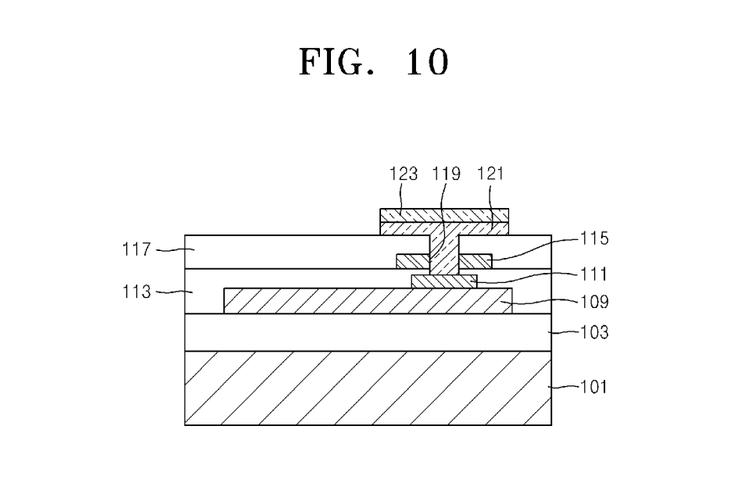

Referring to FIG. 10, a third insulating layer 117 is formed on the second insulating layer 113 to cover the second metal layer 115. The third insulating layer 117 is formed using the same material and the same method as the first insulating layer 103 and the second insulating layer 113. By patterning the third insulating layer 117, a contact hole 119 is formed through the second metal layer 112 and exposes an upper portion of the first threshold switching layer 111.

Next, a phase change layer 121 is formed in the contact hole 119 and to cover a part of the third insulating layer 117, and a second threshold switching layer 123 is formed on the phase change layer 121. The second threshold switching layer 123 conducts the same function as the first threshold switching layer 111 and is formed using the same material as the first threshold switching layer 111. The phase change layer 121 and the second threshold switching layer 123 are formed by forming a phase change material layer (not shown) and a second threshold switching material layer (not shown) and then patterning the same. The phase change layer 121 is formed of a material that is reversibly convertible between an amorphous state and a crystalline state according to the amount of applied current.

According to the current embodiment of the present invention, the phase change layer 121 is formed of a chalcogenide including S, Se, or Te or an antimony compound including antimony (Sb). Examples of the chalcogenide include GeTe, SbTe, SiTe, SbSe, InSe, GeSbTe, SiSbTe, InSbTe, GaSeTe, SnSbTe, GeSiSbTe, GeSnSbTe, GeSbSeTe, and AgInSbTe. Examples of the antimony compound include GeSb and ZnSb.

Figure 11:
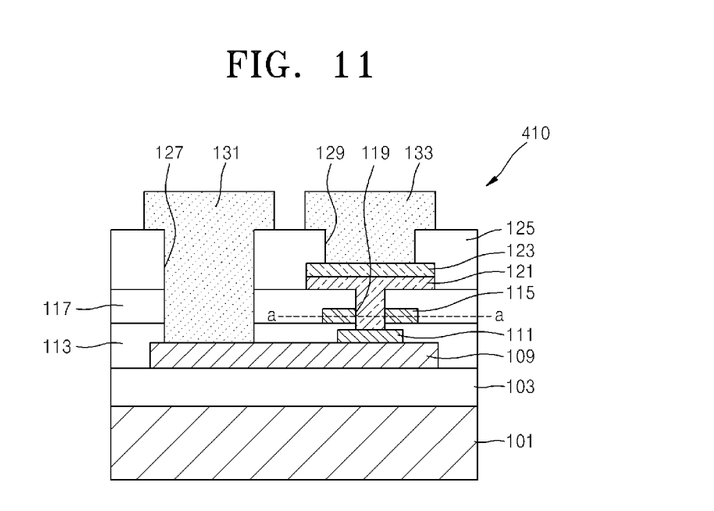
Figure 12:
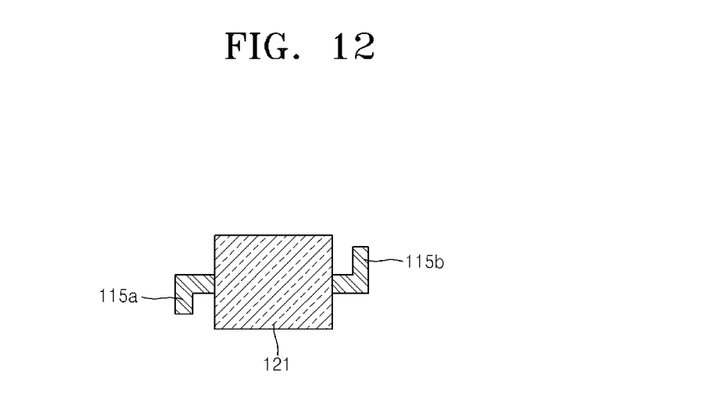

Referring to FIGS. 11 and 12, FIG. 12 is a plan view taken along a line a-a of FIG. 11. A fourth insulating layer 125 is formed on part of the third insulating layer 117 to partly cover the phase change layer 121 and the second threshold switching layer 123. The fourth insulating layer 125 is formed using the same material as the third insulating layer 117. Via holes 127 and 129 that expose an upper portion of the first metal layer 109, the second metal layer 115, and the second threshold switching layer 123 are formed by patterning the fourth insulating layer 125. The exposed portion of the second metal layer 115 is disposed in a perpendicular direction to a ground surface and thus is not illustrated.

Next, third and fourth metal layers 131 and 133 are formed in the via holes 127 and 129 using the same material and the same method as the first metal layer 109 and the second metal layer 115. The third and fourth metal layers 131 and 133 are formed by forming a metal material layer (not shown) in the via holes 127 and 129 and patterning the same. In the non-volatile programmable device 410, the third metal layer 131 connected to the first metal layer 109 is a first terminal (N1). The fourth metal layer 133 connected to the second threshold switching layer 123 is a second terminal (N2). Referring to FIG. 12, the width of the second metal layer 115 is less than the width of the phase change layer 121. When the phase change layer 121 is programmed in a reset state, two terminals 115a and 115b of the second metal layer 115 are electrically insulated from each other. In other words, the terminals 115a and 115b are a third terminal (N3) and a fourth terminal (N4), respectively.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile programmable device comprising:
   a first metal layer formed on a semiconductor substrate;
   a first threshold switching layer formed on a portion of the first metal layer;
   a second metal layer formed on the first metal layer and the first threshold switching layer, wherein a first portion of an insulating layer is interposed between the first metal layer and the second metal layer, and a second portion of the insulating layer is interposed between the first threshold switching layer and the second metal layer;

a phase change layer formed through the second metal layer and the insulating layer, and connected to the first threshold switching layer;

a second threshold switching layer formed on the phase change layer;

a third metal layer that is connected to the first metal layer; and a fourth metal layer formed on the second threshold switching layer, wherein the third metal layer and the fourth metal layer are first and second terminals connected to the first threshold switching layer and the second threshold switching layer, respectively, and a side portion of the second metal layer and another side portion opposite to the side portion of the second metal layer are third and fourth terminals which are respectively connected to the phase change layer, wherein a material of the phase change memory layer is different from a material of the first threshold switching material layer, and the material of the phase change layer is different from a material of the second threshold switching layer.

2. The non-volatile programmable device of claim 1, further comprising a metal-oxide-semiconductor (MOS) transistor having a source/drain terminal connected to the third and fourth terminal and a gate terminal connected to the second terminal.

3. A non-volatile programmable device comprising:
a contact hole formed in an insulating layer;
a first via hole disposed on a first side of the contact hole;
a second via hole disposed over the contact hole;
a first terminal disposed in the first via hole;
a first threshold switching layer disposed under the contact hole and coupled to the first terminal through a first metal layer;
a phase change layer disposed in the contact hole and coupled to the first threshold switching layer;
a second threshold switching layer disposed over the contact hole and coupled to the phase change layer;
a second terminal disposed in the second via hole and coupled to the second threshold switching layer; and
a third terminal and a fourth terminal respectively coupled to a first side portion of the phase change layer and a second side portion opposite to the first side portion of the phase change layer, wherein the first and second threshold switching layers become more conductive when an electrical potential of at least a threshold value is applied thereto, and return to be resistive when the electrical potential is not applied, wherein a material of the phase change memory layer is different from a material of the first threshold switching material layer, and the material of the phase change layer is different from a material of the second threshold switching layer.

4. The non-volatile programmable device of claim 3, wherein the phase change layer is formed of a chalcogenide including sulfur (S), selenium (Se), or tellurium (Te), or a combination thereof, or an antimony compound including antimony (Sb).

5. The non-volatile programmable device of claim 3, wherein the first and second threshold switching layers are formed of a chalcogenide that includes sulfur (S), selenium (Se), or tellurium (Te), or a combination thereof, and that further includes arsenic (As), or phosphorus (P), or both.

6. The non-volatile programmable device of claim 3, further comprising a metal-oxide-semiconductor (MOS) transistor having a source/drain terminal coupled to the third terminal or the fourth terminal and a gate terminal coupled to the second terminal.

7. The non-volatile programmable device of claim 3, wherein an electrical pulse is supplied to the phase change layer through the first terminal, the first threshold switching layer, the second threshold switching layer, and the second terminal to generate a reversible phase change of the phase change layer and control an electric signal that moves through the third terminal, the phase change layer, and the fourth terminal.

8. The non-volatile programmable device of claim 7, wherein the first threshold switching layer and the second threshold switching layer are formed of a threshold switching material.

9. The non-volatile programmable device of claim 7, wherein the phase change layer is formed of a material that changes reversibly between an amorphous state and a crystalline state according to an amount of applied current.

10. The non-volatile programmable device of claim 1, wherein a width of an upper surface of the phase change layer is greater than a width of a lower surface of the phase change layer.

11. The non-volatile programmable device of claim 3, wherein a width of an upper surface of the phase change layer is greater than a width of a lower surface of the phase change layer.

12. The non-volatile programmable device of claim 11, wherein an interface between the upper surface of the phase change layer and the second threshold switching layer is larger than an interface between the lower surface of the phase change layer and the first threshold switching layer.

* * * * *